(12) United States Patent
Escobar-Bowser et al.

(10) Patent No.: US 7,646,219 B2
(45) Date of Patent: Jan. 12, 2010

(54) TRANSLATOR CIRCUIT HAVING INTERNAL POSITIVE FEEDBACK

(75) Inventors: Priscilla E. Escobar-Bowser, Plano, TX (US); Indumini Ranmuthu, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/191,910

(22) Filed: Aug. 14, 2008

(65) Prior Publication Data

US 2009/0302890 A1 Dec. 10, 2009

Related U.S. Application Data

(60) Provisional application No. 61/058,965, filed on Jun. 5, 2008.

(51) Int. Cl.
*H03K 19/0175* (2006.01)
(52) U.S. Cl. .............................. 326/66; 326/73; 326/77
(58) Field of Classification Search ............. 326/64–67, 326/73–74, 76–78
See application file for complete search history.

(56) References Cited

U.S. PATENT DOCUMENTS 5,424,658 A    6/1995   Sikkink et al.
5,459,412 A   10/1995   Mentzer
5,528,171 A *  6/1996   Doi et al. ........................ 326/66
6,211,699 B1 * 4/2001   Sudjian ........................ 326/66

* cited by examiner

*Primary Examiner*—Anh Q Tran
(74) *Attorney, Agent, or Firm*—Dawn V. Stephens; Wade James Brady, III; Frederick J. Telecky, Jr.

(57) ABSTRACT

An integrated circuit (200) includes a translator circuit (210) for translating from a lower logic-level voltage range signal (101(*a*), 101(*b*)) to a higher logic-level voltage range signal (141(*a*), 141(*b*)). The translator (210) includes a differential input stage (110) including a first (Q39) and a second input transistor (Q38) coupled to receive at least a first input signal (101(*a*), 101(*b*)) that defines the lower voltage range signal. A voltage follower 120 includes first and second follower transistors (Q41, Q40). An output of the first and second input transistors (Q39, Q38) is coupled to inputs of the first and second follower transistors (Q41, Q40). A dynamic gain boosting switching circuit (130) is coupled to receive outputs from the first and second follower transistors (Q41, Q40) and includes a first and a second control node (131, 132). The switching circuit (130) include a first positive feedback loop including a first internal feedback transistor (MN1) that reinforces a signal level at the first control node (131) and a second positive feedback loop including a second internal feedback transistor (MN2) that reinforces a signal level at the second control node 132. An output stage (140) has at least one input coupled to receive at least one output signal from the switching circuit (130) and provide at least one translated output supplying the higher logic-level voltage range signal.

20 Claims, 2 Drawing Sheets

TRANSLATOR CIRCUIT HAVING INTERNAL POSITIVE FEEDBACK

CROSS-REFERENCE TO RELATED APPLICATIONS

This application claims priority to Provisional Application No. 61/058,965 entitled "High gain-high speed ECL to CMOS translator employing positive feedback" filed on Jun. 5, 2008, which is incorporated by reference in its entirety into the present application.

FIELD OF THE INVENTION

The present invention relates to translator circuits for changing the logic levels associated with the operation of lower logic-level voltage circuitry to the logic levels associated with the operation of higher logic-level voltage circuitry.

BACKGROUND

In order to take advantage of both the fast switching rates of bipolar transistors and the low power consumption of MOS transistors, bipolar and MOS transistors can be combined on the same chip to form what is commonly known as BiCMOS circuitry. In other arrangements, systems are designed that have both bipolar circuits and MOS circuits. In either case, it is often necessary to address the difference in the logic level swings associated with the two transistor types so as to resolve the problems which this difference can cause. Translators circuits are known to effect that transition. A conventional emitter coupled logic (ECL)-to-CMOS translator comprises a complementary ECL input stage including an emitter follower based level shifter and a CMOS output stage. In some ECL to CMOS applications, such as a mobile writer for driving an H-bridge circuit, the translator can be required to translate 300 mV range ECL signals about an order of magnitude higher to a CMOS signal range of about 4 to 5 Volts.

Translators inherently introduce delay; that is, it takes time to switch between bipolar logic levels and CMOS logic levels. As transistors become increasingly small in order to achieve the faster transmission rates needed, the corresponding differential swings associated with their logic outputs are reduced. Accordingly, as known in the art, since conventional translator designs tradeoff speed and gain, conventional translators can become the bottleneck in systems they are used in because the translator is generally slower, and can be significantly slower, as compared to the downstream logic functions that are coupled to receive the gained output provided by the translator.

SUMMARY

This Summary is provided to comply with 37 C.F.R. §1.73, presenting a summary of the invention to briefly indicate the nature and substance of the invention. It is submitted with the understanding that it will not be used to interpret or limit the scope or meaning of the claims.

Embodiments of the invention provide new translator circuits that include signal reinforcing (positive) feedback to internal nodes therein. The positive feedback has been found to simultaneously significantly increase both the gain and speed of the translator circuit. Significantly, positive feedback as described herein allows translator circuits according to embodiments of the invention to generally no longer tradeoff speed and bandwidth. Embodiments of the invention are particularly well suited for relative high gain voltage translations, such as ECL to CMOS, but can also be used for a variety of other translation applications that also need highly gain boosted signal levels with minimal phase delay.

Embodiments of the invention include an integrated circuit including a translator circuit for translating from a lower logic-level voltage range signal to a higher logic-level voltage range signal. The translator includes a differential input stage including a first and a second input transistor coupled to receive at least a first input signal that defines the lower voltage range signal. A voltage follower includes first and second follower transistors. An output of the first and second input transistors is coupled to inputs of the first and second follower transistors. A dynamic gain boosting switching circuit is coupled to receive outputs from the first and second follower transistors and includes a first and a second control node. The switching circuit include a first positive feedback loop including a first internal feedback transistor that reinforces a signal level at the first control node and a second positive feedback loop including a second internal feedback transistor that reinforces a signal level at the second control node. An output stage has at least one input coupled to receive at least one output signal from the switching circuit and provides at least one translated output supplying the higher logic-level voltage range signal.

DETAILED DESCRIPTION

Figure 1:
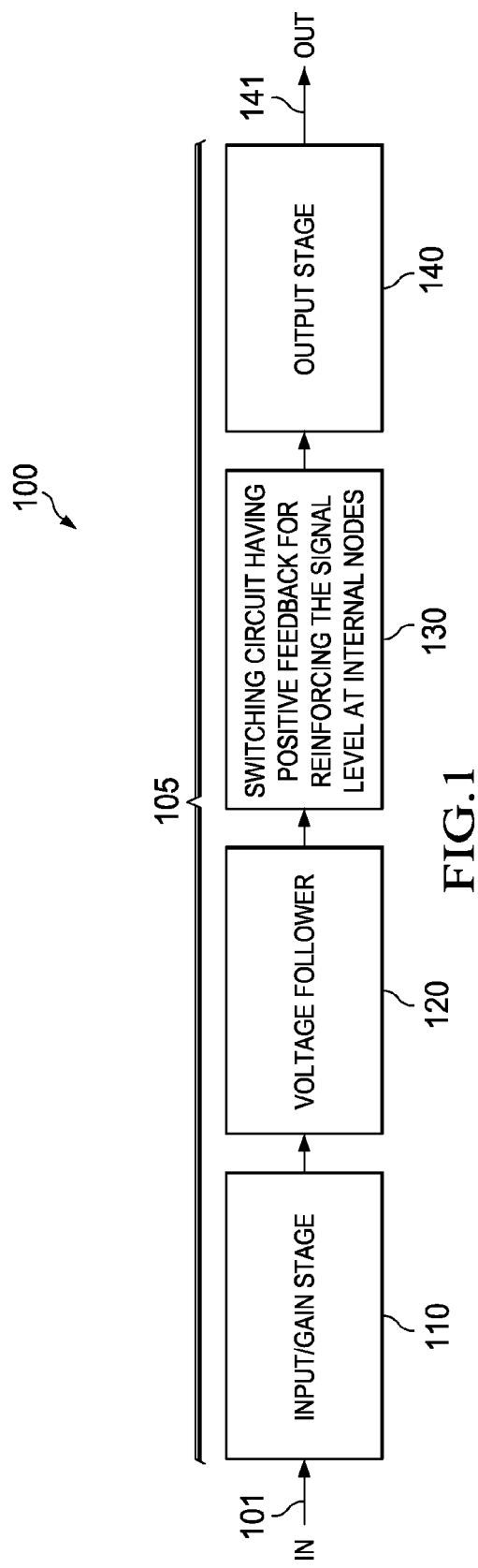
FIG. 1 is a block diagram of an integrated circuit including a translator circuit according to an embodiment of the invention.

The present invention is described with reference to the attached figures, wherein like reference numerals are used throughout the figures to designate similar or equivalent elements. The figures are not drawn to scale and they are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

FIG. 1 is a block diagram of an integrated circuit 100 comprising a translator circuit 105 according to an embodiment of the invention operable for translating a lower logic-level voltage range signal received to a higher logic-level voltage range signal. The translator 100 comprises an input/gain stage 110 coupled to receive at least one input logic signal, shown as input signal 101, which defines a lower voltage range. In one embodiment the integrated circuit 100 can include an ECL buffer (not shown) for receiving at least one externally provided ECL input signal(s) which is coupled to an ECL driver, wherein the ECL driver provides the input signal (or signals) 101. In one typical embodiment, translator 105 comprises an ECL-to CMOS translator 105 that receives as inputs a differential ECL input on a pair of input pins, such as positive ECL (PECL) input.

The input stage 110 provides gain and generally comprises a differential input stage comprising a first and a second input transistor. The resulting signal currents are typically converted to a differential voltage signal using a load, such as load resistors. A voltage follower stage 120 is coupled to the input stage 110. The voltage follower stage 120 can comprise first and second emitter follower transistors or first and second source follower transistors. The voltage follower stage provides level shifting and buffering. A switching circuit 130 is coupled to receive the differential output provided by the voltage follower stage 120. The switching circuit 130 includes first and second control nodes that are coupled to the output of the first and second follower transistors. The switching circuit 130 includes a pair of internal positive feedback loops that provides an additional dynamic gain boost. In one embodiment the switching circuit 130 can comprise a pair of cross coupled differential gain stages that each include positive feedback loop circuits that reinforce a signal level at a control node provided therein to provide an additional dynamic gain boost. An output stage 140 having at least one input is coupled to receive at least one output from the switching circuit 130 and provide at least one output 141 that supplies the higher logic-level voltage range signal. The output stage can provide additional voltage gain.

Figure 2:
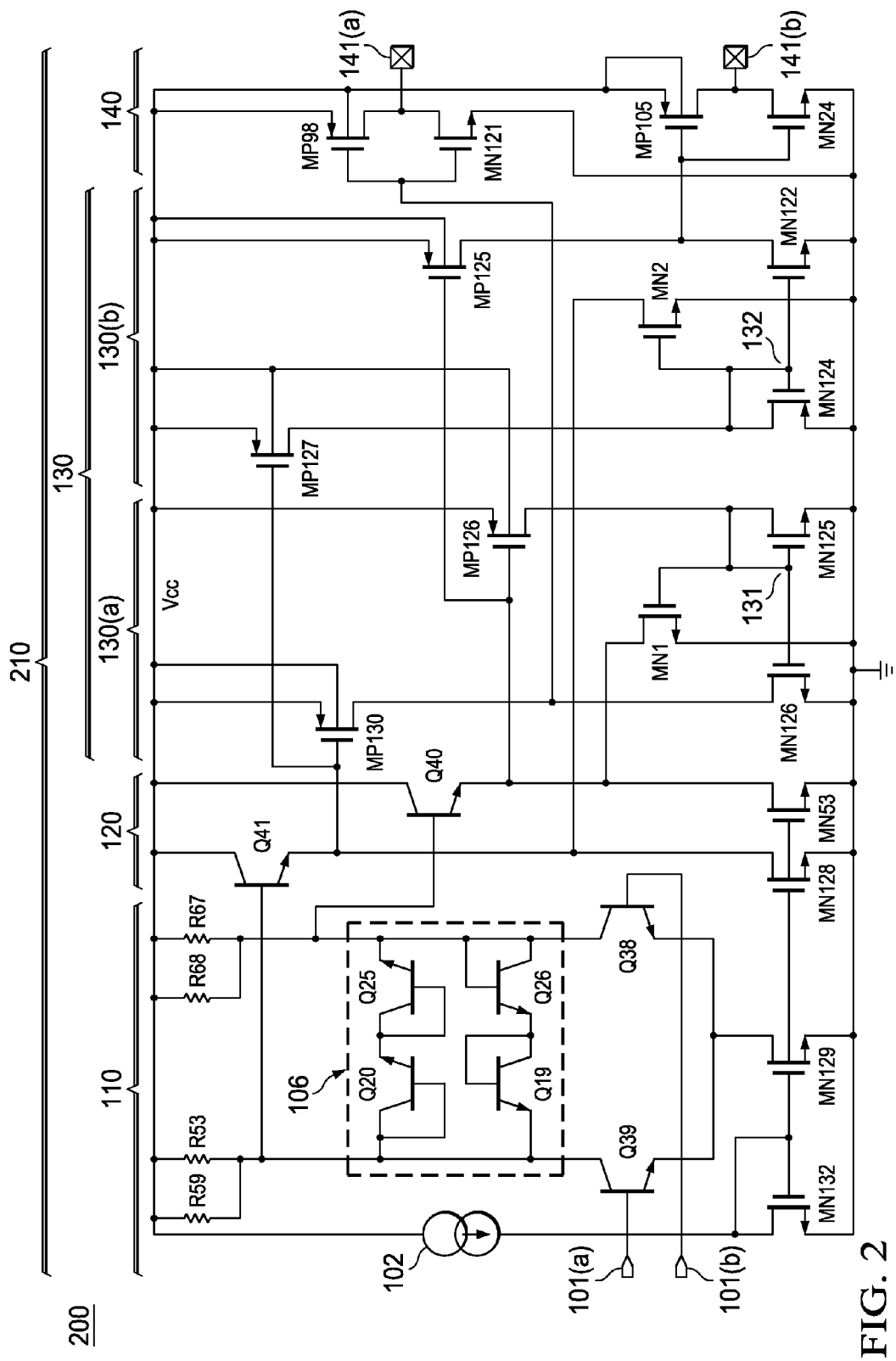
FIG. 2 is schematic diagram of an ECL-to CMOS translator according to an embodiment of the invention.

FIG. 2 is schematic diagram of an integrated circuit 200 including an ECL-to CMOS translator circuit 210 according to an embodiment of the invention. The input stage 110 shown comprises a bipolar differential input stage comprising a first input transistor Q39 and a second input transistor Q38. The base of the first input transistor Q39 receives a first input signal 101(*a*), while the base of the second input transistor Q38 is coupled to receive the second input signal 101(*b*). The first input signal 101(*a*) and second input signal 101(*b*) can be complements of one another, such as ECL signals. Q39 and Q38 are shown coupled to the high potential power rail, Vcc, by the gain resistors R69//R53 and R68//R67, which each convert the respective currents from the input transistors Q39 and Q38 to voltage signals to provide a differential voltage signal. Input stage 110 also includes current source 102 which is coupled to a current mirror which comprises MN132 and MN129 (the current mirror also includes MN 128 and MN53 which are associated with voltage follower stage 120 described below). MN 129 is coupled to the emitters of Q38 and Q39. Input stage 110 also includes voltage clamping circuitry 106 comprising Q19 and Q29, and Q20 and Q25 which limits the difference in the collector voltages between Q38 and Q39 to two (2) diode drops.

A voltage follower stage 120 is coupled to the input stage 110 to receive the differential voltage signal. The voltage follower stage 120 shown comprises first and second emitter follower transistors, Q41 and Q40. The bases of Q41 and Q40 are coupled to the collectors of Q39 and Q38, respectively. Current mirror transistors MN128 and MN53 are coupled to the emitters of Q41 and Q40, respectively. As described above, voltage follower stage 120 can alternatively comprise a MOS follower stage, such as a source follower arrangement.

A switching circuit 130 is coupled to receive the differential signal provided at the output (emitters) of the emitter followers Q41 and Q40. Switching circuit 130 is shown comprising MOS gain stages 130(*a*) and 130(*b*) with some positive feedback described below. Switching circuit 130 comprises common source NMOS transistors MN 125 and MN 124 that each define first and second control nodes 131 and 132, wherein MN 125 and control node 131 are in gain stage 130(*a*), and MN 124 and control node 132 are in gain stage 130(*b*). MN 125 and MN 124 are both "diode" connected, wherein their gates are shorted to their drains. MN 126 and MN 122 constitute current mirroring transistors, wherein MN 125 and MN 126 constitute a current mirror as does MN 124 and MN 122. MP 126 is connected between the drain of MN 125 and VCC, while MP 127 is connected between the drain of MN 124 and VCC. Common source NMOS transistor MN 125 is coupled to the emitter output of the second follower transistor Q 40 by MP 126. Common source NMOS transistor MN 124 is coupled to the emitter output of the first follower transistor Q 41 by MP 127.

MN 1 and MN 2 are internal feedback transistors that close respective internal positive feedback loops that reinforce the signals at control node 131 associated with MN 125 and the signal at control node 132 associated with MN 124, respectively, and thus provide an additional dynamic gain boost. The first internal positive feedback loop is associated with the control node of MN 125 and comprises MN 1 and MP 126. In operation, when the control node 131 associated with MN 125 is charging to a high voltage state, MN 1 is turned on, which pulls the gate node of MP 126 low (e.g. to GND) to reinforce MP 126 being on, thus reinforcing and speeding the transition of control node 131 associated with MN 125 to a high state by adding gain. Similarly, the internal loop associated with the control node of MN 124 comprises MN 2 and MP 127. In operation, this internal loop reinforces and speeds the transition of node 132 associated with MN 124 to a high state.

The differential voltage output of switching circuit 130 is shown in FIG. 2 taken from the drain of MN 126 in differential gain stage 130(*a*) and the drain of MN 122 in differential gain stage 130(*b*), and is coupled to inputs of output stage 140. Output stage 140 comprises inverter gain stages formed by MP98/MN121 and MP105/MN24, respectively. The common gate of inverter MP 98/MN 121 is connected to the drain of MN 126, while the common gate of inverter MP 105/MN 24 is connected to the drain of MN 122.

In typical operation, ECL-to CMOS translator circuit 210 receives as inputs on pins 101(*a*) and 101(*b*) a differential ECL signal which gets gained by the differential input stage 110 comprising Q39 and Q38, with the resulting currents converted to a differential voltage signal thru load resistors R69//R53 and R68//R67. The differential signal then gets level shifted and buffered by voltage follower stage 120 comprising emitter follower transistors Q40 and Q41. The differential signal at the output (emitters) of the voltage followers Q41 and Q40 gets further gained up by the switching circuit 130 which comprises cross coupled differential gain stages 130(*a*) and 130(*b*), which have an additional dynamic gain boost provided by internal feedback transistors MN1 and MN2. The differential voltage output of switching circuit 130 gets another voltage amplification thru output stage 140 which comprises inverter gain stages formed by MP98 and MN121 and MP 105 and MN24. Translator circuit 210 provides a highly gain boosted signal level, such as a gain of >10, with minimal phase delay as evidenced by the data described in the Example below.

EXAMPLE

The following non-limiting Example serve to illustrate selected embodiments of the invention. It will be appreciated that variations in proportions and alternatives in elements of the components shown will be apparent to those skilled in the art and are within the scope of embodiments of the present invention.

The following Example serves to describe dynamic operation of ECL-to CMOS translator circuit 210. The operation of translator circuit 210 is compared to an otherwise equivalent translator circuit that only lacked the internal feedback transistors MN1 and MN2. Respective power supplies were set at 5 Volts and −3 Volts for all tests, and the input signal was ~600 mV differential signal with ~2V common mode. It was found that translator circuit 210 provided >2 Gbps operation (<500 psec delay), which was about twice the speed of an otherwise equivalent translator circuit that only lacked internal feedback transistors MN1 and MN2, while still providing a gain ≧10.

Particularly significant was the finding that translator circuit 210 still provided >2 Gbps operation (<500 psec delay) at high T, such as at 135° C. High temperature is known to generally be the most challenging condition for most translators and can result in the inability to have the required bandwidth to process a given high speed ECL signal. In such conventional cases, failure at high T can result in the translator being redesigned to reduce the gain to increase the bandwidth, preventing the translator from applications such as for mobile H-Bridge writer systems which as described above generally need an order of magnitude or more of gain.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents. In addition, while a particular feature of the invention may have been disclosed with respect to only one of several implementations, such feature may be combined with one or more other features of the other implementations as may be desired and advantageous for any given or particular application.

In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. For example, as known in the art, bipolar circuitry may generally be substituted for CMOS circuitry disclosed, CMOS circuitry for bipolar circuitry disclosed, as well as one transistor type for another (e.g. PMOS for NMOS or PNP for NPN).

The terminology used herein is for the purpose of describing particular embodiments only and is not intended to be limiting of the invention. As used herein, the singular forms "a", "an" and "the" are intended to include the plural forms as well, unless the context clearly indicates otherwise. Furthermore, to the extent that the terms "including", "includes", "having", "has", "with", or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The Abstract of the Disclosure is provided to comply with 37 C.F.R. § 1.72(b), requiring an abstract that will allow the reader to quickly ascertain the nature of the technical disclosure. It is submitted with the understanding that it will not be used to interpret or limit the scope or meaning of the following claims.

We claim:

1. An integrated circuit including a translator circuit for translating from a lower logic-level voltage range signal to a higher logic-level voltage range signal, said translator circuit comprising:
   a differential input stage comprising a first and a second input transistor coupled to receive at least a first input signal that defines said lower voltage range signal;
   a voltage follower comprising first and second follower transistors, an output of said first and second input transistors coupled to inputs of said first and said second follower transistors, respectively;
   a switching circuit coupled to receive outputs from said first and second follower transistors comprising a first and a second control node, wherein said switching circuit comprises a first positive feedback loop comprising a first internal feedback transistor that reinforces a signal level at said first control node and a second positive feedback loop comprising a second internal feedback transistor that reinforces a signal level at said second control node, and
   an output stage having at least one input coupled to receive at least one output signal from said switching circuit and provide at least one translated output supplying said higher logic-level voltage range signal.

2. The integrated circuit of claim 1, wherein said switching circuit comprises a pair of common source first and second NMOS transistors, said first NMOS transistor providing said first control node and said second NMOS transistor providing said second control node, wherein said first NMOS transistor is coupled to said output of said first follower transistor by said first internal feedback transistor and said second NMOS transistor is coupled to said output of said second follower transistor by said second internal feedback transistor.

3. The integrated circuit of claim 2, wherein said switching circuit comprises cross coupled first and second differential gain stages, wherein said first differential gain stage comprises said first NMOS transistor and said second differential gain stage comprises said second NMOS transistor.

4. The integrated circuit of claim 2, wherein said first and said second NMOS transistors are common source coupled.

5. The integrated circuit of claim 4, wherein said first and second NMOS transistors are both diode connected.

6. The integrated circuit of claim 1, wherein said differential input stage comprises a bipolar differential input stage arranged in a common emitter configuration.

7. The integrated circuit of claim 2, wherein said output of switching circuit is a differential voltage output, said switching circuit further comprising a first NMOS current mirroring transistor having a gate coupled to a gate of said first NMOS transistor and a second NMOS current mirroring transistor having a gate coupled to a gate of said second NMOS transistor, wherein said first and second mirroring transistors provide said differential output voltage.

8. The integrated circuit of claim 7, wherein said output stage comprises a first and a second CMOS inverter gain stage for providing complementary first and second outputs, further wherein an input of said first inverter is coupled a drain of said first mirroring transistor and an input of said second inverter is coupled to a drain of said second mirroring transistor.

9. The integrated circuit of claim 2, wherein said switching circuit further comprises a first PMOS transistor coupled between a drain of said first NMOS transistor and a positive power supply line and a second PMOS transistor coupled between a drain of said second NMOS transistor and said positive power supply line.

10. The integrated circuit of claim 9, wherein said first NMOS transistor is coupled to said output of said second follower transistor by said first PMOS transistor, and said second NMOS transistor is coupled to the said output of said first follower transistor by said second PMOS transistor.

11. The integrated circuit of claim 2, wherein a gate of said first internal feedback transistor is coupled to a gate of said first NMOS transistor and a drain of said first internal feedback transistor coupled to said output of said second follower transistor, further wherein a gate of said second internal feedback transistor is coupled to a gate of said second NMOS transistor and a drain of said second internal feedback transistor is coupled to said output of said first follower transistor.

12. The integrated circuit of claim 1, wherein said lower logic-level voltage range signal comprises positive ECL (PECL) and said higher logic-level voltage range signal comprises a CMOS logic level.

13. The integrated circuit of claim 12, wherein a voltage gain provide by said translator is $\geq 10$.

14. An integrated circuit including a translator circuit for translating from a lower logic-level voltage range signal to a higher logic-level voltage range signal, said translator circuit comprising:
  a bipolar differential input stage arranged in a common emitter configuration comprising a first and a second input transistor coupled to receive at least a first input signal that defines said lower voltage range signal;
  a voltage follower comprising first and second follower transistors, an output of said first and second input transistors coupled to inputs of said first and said second follower transistors, respectively;
  a switching circuit coupled to receive outputs from said first and second follower transistors comprising first and said second source coupled NMOS transistors that are both diode connected and provide first and second control nodes respectively, said switching circuit arranged in cross coupled first and second differential gain stages, wherein said first differential gain stage comprises said first NMOS transistor and said second differential gain stage comprises said second NMOS transistor, further wherein said switching circuit comprises a first positive feedback loop comprising a first internal feedback transistor that reinforces a signal level at said first control node and a second positive feedback loop comprising a second internal feedback transistor that reinforces a signal level at said second control node, said first NMOS transistor being coupled to said output of said first follower transistor by said first internal feedback transistor and said second NMOS transistor is coupled to said output of said second follower transistor by said second internal feedback transistor, and
  an output stage having at least one input coupled to receive at least one output signal from said switching circuit and provide at least one translated output supplying said higher logic-level voltage range signal.

15. The integrated circuit of claim 14, wherein said output of switching circuit is a differential voltage output, said switching circuit further comprising a first NMOS current mirroring transistor having a gate coupled to a gate of said first NMOS transistor and a second NMOS current mirroring transistor having a gate coupled to a gate of said second NMOS transistor, wherein said first and second mirroring transistors provide said differential output voltage.

16. The integrated circuit of claim 15, wherein said output stage comprises a first and a second CMOS inverter gain stage for providing complementary first and second outputs, further wherein an input of said first inverter is coupled a drain of said first mirroring transistor and an input of said second inverter is coupled to a drain of said second mirroring transistor.

17. The integrated circuit of claim 14, wherein said switching circuit further comprises a first PMOS transistor coupled between a drain of said first NMOS transistor and a positive power supply line and a second PMOS transistor coupled between a drain of said second NMOS transistor and said positive power supply line.

18. The integrated circuit of claim 17, wherein said first NMOS transistor is coupled to said output of said second follower transistor by said first PMOS transistor, and said second NMOS transistor is coupled to the said output of said first follower transistor by said second PMOS transistor.

19. The integrated circuit of claim 14, wherein a gate of said first internal feedback transistor is coupled to a gate of said first NMOS transistor and a drain of said first internal feedback transistor coupled to said output of said second follower transistor, further wherein a gate of said second internal feedback transistor is coupled to a gate of said second NMOS transistor and a drain of said second internal feedback transistor is coupled to said output of said first follower transistor.

20. The integrated circuit of claim 14, wherein said lower logic-level voltage range signal comprises positive ECL (PECL) and said higher logic-level voltage range signal comprises a CMOS logic level, wherein a voltage gain provide by said translator is $\geq 10$.

* * * * *